(12) United States Patent
Hwang

(10) Patent No.: US 6,798,227 B1
(45) Date of Patent: Sep. 28, 2004

(54) TWO AXIS SELF-CENTERING PROBE BLOCK ASSEMBLY WITH TWO AXIS FLOAT AND SELF-ALIGNMENT

(75) Inventor: David Hwang, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/602,331

(22) Filed: Jun. 24, 2003

(51) Int. Cl.⁷ .............................................. G01R 31/02
(52) U.S. Cl. .................. 324/754; 34/158.1; 439/246; 439/324
(58) Field of Search ................................. 324/754, 756, 324/757, 758, 761, 762, 765, 158.1; 439/246, 324, 378

(56) References Cited

U.S. PATENT DOCUMENTS

| | | | | |
|---|---|---|---|---|
| 4,190,311 A | * | 2/1980 | Basta | 439/331 |
| 6,198,297 B1 | * | 3/2001 | Riccioni | 324/754 |
| 6,551,126 B1 | * | 4/2003 | Feldman | 439/482 |
| 6,636,058 B2 | * | 10/2003 | Lyford | 324/754 |

* cited by examiner

Primary Examiner—David A. Zarneke
Assistant Examiner—Tung X. Nguyen

(57) ABSTRACT

A novel floating probe block assembly with self-centering capability is presented. In accordance with the invention, a single probe block frame floatably seats a probe block on one or more self-centering springs within the frame along a first axis to center the floating probe block in the vertical plane perpendicular to the direction of probing. Countersunk spring receptacle openings center the floating probe block in the horizontal plane.

20 Claims, 2 Drawing Sheets

TWO AXIS SELF-CENTERING PROBE BLOCK ASSEMBLY WITH TWO AXIS FLOAT AND SELF-ALIGNMENT

BACKGROUND OF THE INVENTION

The present invention relates generally to electrical device testing, and more particularly to a two-axis self-centering floating probe block assembly for testing an electrical device.

Electrical testing of electrical devices often involves insertion probing of a receptacle of the device. For example, a cellular phone often includes a receptacle configured as an array of signal points on the device under test (hereinafter referred to as the "system connector"). The device, in this example a cellular phone, may also include alternatively configured receptacles such as an audio receptacle into which a headset audio plug is inserted or a charger receptacle into which an A/C charger plug is inserted to charge up the device.

During or after manufacturing, various tests are performed on the device (hereinafter referred to as "device under test" or "DUT"). Typically at least one or more tests require insertion probing of one or more of the DUT receptacles. Insertion probing involves the insertion of a probe into a mating DUT receptacle such that the probe and DUT receptacle make electrical contact. The electrical contact is the means through which the probe stimulates and/or receives measurement signals from the DUT. Although insertion probing is itself a conceptually straightforward idea, the design of the probe that is used for this purpose does require several important considerations. First, due to manufacturing limitations, at least some error relative to specification typically exists in the precision of the location of the electrical pads of the device which the probe must electrically contact. Thus, over hundreds and thousands of a given device to be tested, the probe must be designed to take into account the pad location tolerances such that it can reliably make electrical contact with each DUT to be probed.

In order to account for the pad location tolerances of a given DUT design, a "floating" probe block is sometimes used. In a floating probe block, the probe is attached to a block which is encased in substantially conforming frame that holds the block in place while allowing the block a small amount of "wiggle room" within the frame. This solution allows the receptacle itself to assist in aligning the probe within the receptacle. However, this design is not ideal because since the average center position of the DUT receptacle from DUT to DUT is not necessarily aligned with the average resting position of the probe block within its frame, gravity and cable forces tend to bias the probe block to its lowest position within the frame. This increases probing force and wear on the bottom of the probe block. This also limits the probing variance range allowed by the probe.

Another prior solution is to mount the probe block on two non-floating pins. These pins pass through clearance holes in the probe block, and the sizing of the holes is the means by which the float is constrained. These holes are typically formed with a triangular cross-section so that when gravity pulls on the probe block, the holes operate to center the probe block on the pins. This design is also not ideal because the probe block is centered only horizontally (left-to-right) and not vertically (up and down). Accordingly, oftentimes the gravitational force on the block is insufficient for centering the block against cable forces. In addition, this arrangement does not allow for full circular float of the probe block.

Another prior solution involves constraining the float with the outside profile of the probe block. In the float gap, Poron® or some other foam-like material is placed to bias the probe block to the center. This design is also not ideal because the foam can take on a compression set and therefore perform poorly. Additionally, the centering force increases relatively quickly with respect to the distance the probe block is from the center, again increasing wear.

SUMMARY OF THE INVENTION

The present invention is a two-axis self-centering probe block assembly with two-axis float and self-alignment. The invention uniquely provides a floating probe block assembly whose average disengaged position is directly aligned with the average DUT-to-DUT position of the mating receptacle when looking through a plane perpendicular to the probing direction. Additionally, the design of the probe is such that very little force is required by the probe actuator to cause the probe block to self-align. This increases reliability of probing multiple ways. The total amount of float is therefore greater than that achievable in prior art solutions, and the probe block is subject to decreased wear since less friction is involved in self-aligning.

The invention is ideal for use in a test fixture during manufacturing test of a printed circuit board or final-level test of a device under test (DUT) in which the DUT requires some insertion probing of a receptacle. The invention compensates for DUT-to-DUT and fixture-to-fixture differences over thousands of DUTs, in a novel manner that is more reliable than other methods currently used.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

Figure 1:
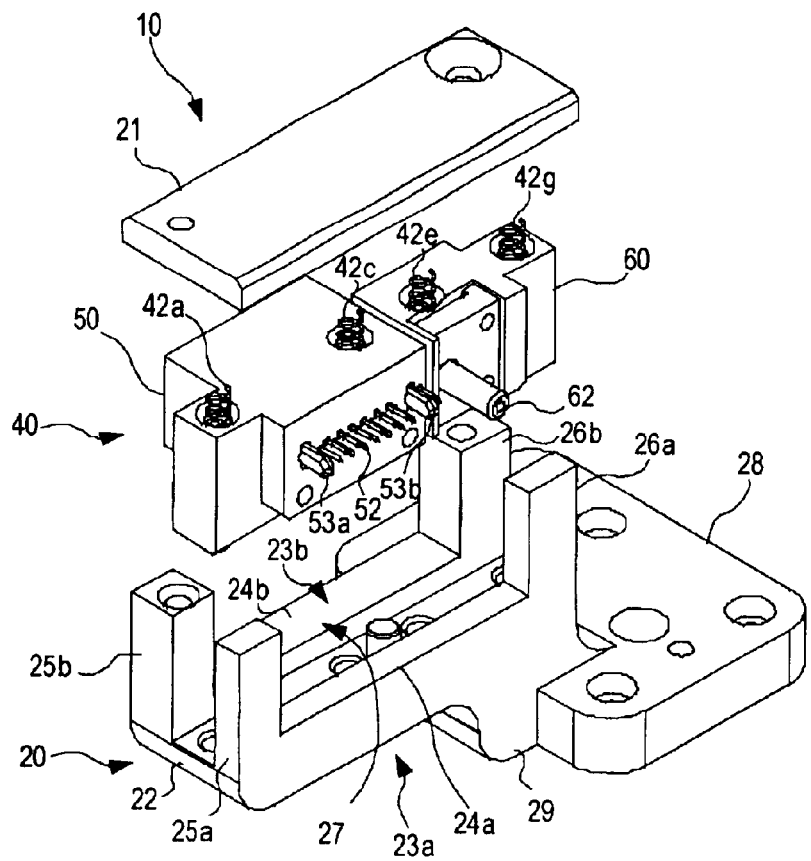
FIG. 1 is an exploded isometric view of a floating probe block assembly implemented in accordance with the invention.

Turning now to the drawings, FIGS. 1–5 illustrate a preferred embodiment of a two-axis self-centering floating probe block assembly 10 with two-axis floating and self-alignment. As illustrated, the probe block assembly 10 includes a probe block 40, a plurality of self-centering springs 42a, 42b, 42c, 42d, 42e, 42f, 42g, 42h, and a probe block frame 20.

In the particular embodiment shown, the probe block 40 comprises two independent blocks, including a system connector probe block 50 for probing a system connector of a DUT (not shown) and an audio jack probe block 60 for probing an audio jack on the DUT. It will be appreciated, however, that the invention works equally well with a single probe block or multiple independent probe blocks housed within the same frame. The system connector probe block 50 is shown in detail in FIG. 3. As illustrated, the system connector probe block 50 comprises a probe block body 51, one or more probes 52, 53a, 53b, and one or more self-centering spring receptacles 54a, 54b, 54c, 54d. In the preferred embodiment, the probe block body 51 is configured as a solid block, formed for example from material such as aluminum or steel. The probes 52, 53a, 53b are electrically connected to wires or traces which are connectable to test and/or measurement circuitry (not shown).

In the illustrative embodiment, the probe block assembly 10 is designed to probe the system connector and audio jack of a cellular phone (not shown). In this example embodiment, the system connector of the cellular phone comprises an array of electrical contact pads and an electrical socket pair. Accordingly, the system connector probe block 50 includes a mating array 52 of spring-loaded probes for contacting the electrical contact pads of the cellular phone and an electrical two-prong plug 53a, 53b for insertion into the cellular phone electrical two-prong socket when the probe block 50 is used to probe the cellular phone system connector.

As previously mentioned, the system connector probe block 50 includes one or more self-centering spring receptacles 54a, 54b, 54c, 54d, each for holding a respective coil spring 42a, 42b, 42c, 42d, of longitudinal length $L_{SPR}$ and having a coil diameter of $D_{COIL}$. In the illustrative embodiment, each independent probe block 50, 60 includes two pairs 54a/b, 54c/d, and 54e/f, 54g/h, respectively, of self-centering spring receptacles. Each receptacle in a given pair 54a/b, 54c/d, and 54e/f, 54g/h of receptacles is located coaxially to the other receptacle in the pair and each opens onto opposing sides of its respective probe block body. In the preferred embodiment, the coaxial axis of each receptacle pair 54a/b, 54c/d, and 54e/f, 54g/h is perpendicular to the probing direction (which is indicated by arrow A in FIG. 2).

In the preferred embodiment, each receptacle 54a, 54b, 54c, 54d, 54e, 54f, 54g, 54h is configured as a cylindrical bore with circular cross-section of constant diameter. Each receptacle 54a, 54b, 54c, 54d, 54e, 54f, 54g, 54h has one opening to a side of the probe block and a wall opposite the opening and within the probe block on which its respective spring is seated. In addition, the receptacle opening 55a, 55b, 55c, 55d, 55e, 55f, 55g, 55h is preferably countersunk, for reasons discussed hereinafter. The cross-sectional diameter $D_{REC}$ of the cylindrical receptacle is a known precise amount greater than the cross-sectional diameter $D_{COIL}$ of the self-centering coil spring 42a, 42b, 42c, 42d, 42e, 42f, 42g, 42h that is designed to fit into it, and is sufficient to allow a small amount of "wiggle room" without allowing significant shear (side-to-side) deflection. The length of the receptacle $L_{REC}$ is a known precise amount less than the longitudinal length $L_{SPR}$ of the coil spring 42a, 42b, 42c, 42d, 42e, 42f, 42g, 42h when the coil spring is in a non-deformed state.

A coil spring 42a, 42b, 42c, 42d, 42e, 42f, 42g, 42h characterized by a longitudinal length $L_{SPR}$ and cross-sectional diameter of $D_{COIL}$ as just described is mounted in each receptacle 54a, 54b, 54c, 54d, 54e, 54f, 54g, 54h of the probe block 40.

The probe block frame 20 is substantially conforming to the outer shape (less the probes and certain other protruding features) of the probe block and includes apertures 27 to allow the probes and other protruding features to protrude outside the frame 20 when the probe block 40 is seated within the probe block frame 20. The inner dimensions of the probe block frame substantially match those of the outer dimensions of the probe block plus a small predetermined amount sufficient to allow a certain amount of "wiggle room" but insufficient to allow significant displacement of the independent probe blocks 50, 60 from their average position in the frame. This allows the probe block 40 to "float" within the probe block frame 20.

In the illustrative embodiment, the probe block frame 20 includes a front frame arm 23a, a rear frame arm 23b, a frame base 22, and a frame cover 21. The front frame arm 23a is substantially U-shaped, having two vertical members 25a, 26a separated by a horizontal base 24a. Formed integral to the horizontal base 24a is a frame attachment member 29 configured to mate with an arm attachment base 28 that is attachable to a robotic actuator (not shown).

The rear frame arm 23b is formed substantially identical to the front frame member 23a. The horizontal bases 24a, 24b of the front frame arm 23a and rear frame arm 23b are respectively attached on top of and along the respective front and rear edges of the frame base 22, such that the front frame arm 23a and rear frame arm 23b are aligned front-to-rear and separated by a distance determined by the width of the frame base 22. The frame cover 21 attaches to the top of the vertical members 25a, 26a, 25b, 26b of the front frame arm 23a and rear frame arm 23b.

When the probe block frame 20 is assembled, it forms an inner cavity with one or more apertures 27 through which probes 52, 53a, 53b, 62 and other protruding features of the probe block 40 may extend outside the frame 20 when the probe block 40 is seated within the probe block frame 20. The inner cavity substantially conforms to the outer shape and dimensions of the probe block 20, less any protrusions that extend through the apertures 27 of the probe block frame 20. The dimensions of the inner cavity are designed to be a predetermined small amount (e.g., several millimeters, sufficient to allow a small amount of "wiggle room") greater than the respective matching dimensions of the probe block 40. This allows the probe block 40 to "float" within the probe block frame 20 when the probe block is seated within the inner cavity of the assembled probe block frame.

To assemble the probe block assembly 10, the frame cover 21 is removed from the probe block frame 20. Self-centering springs 42a, 42b, 42c, 42d, 42e, 42f, 42g, 42h are seated within the self-centering spring receptacles 54a, 54b, 54c, 54d, 54e, 54f, 54g, 54h of the probe block 40, and the probe block 40 (including independent probe blocks 50 and 60) is inserted into the inner cavity of the probe block frame 20 through the uncovered top of the frame. Preferably, the probe block frame 20 includes countersunk spring receptacles 70a, 70b, 70c, 70d, 70e, 70f, 70g, 70h that match up with the locations of the self-centering springs 42a, 42b, 42c, 42d, 42e, 42f, 42g, 42h when the probe block 40 is seated within the frame 20. Accordingly, in the illustrative embodiment, since the self-centering springs 42a, 42b, 42c, 42d, 42e, 42f, 42g, 42h are mounted to extend out the top and bottom of the probe block 40, matching countersunk spring receptacles 70b, 70d, 70f, 70h, and 70a, 70c, 70e, 70f are respectively formed in the base 22 and cover 21 of the probe block frame 20. When inserting the probe block 40 into the open frame, the protruding portions of the springs 42b, 42d, 42f, 42h on the bottoms of the independent probe blocks are carefully inserted into their respective countersunk spring receptacles 70b, 70d, 70f, 70h of the frame base 22. The cover 21 is then aligned over the top of the frame 20, carefully aligning the respective countersunk spring receptacles 70a, 70c, 70e, 70g, of the frame cover 21 over the protruding portions of the springs 42a, 42c, 42e, 42g on the tops of the independent probe blocks 50, 60, and the cover 21 is attached (for example, via screws).

During use, the arm attachment base 28 of the probe block frame 20 is fixedly attached to a linear actuator (pneumatic or otherwise, such as an actuating robotic arm, not shown) that moves in the probing direction as indicated by arrow A. The actuator operates to move the frame 20 with probe block 40 therein to engage the probes 52, 53a, 53b, 62 of the probe block 40 with the matching probe receptacles on the DUT.

When engaged, the alignment features in the probe block 40 align to mating features in the DUT and insert to make electrical contact.

Figure 2:
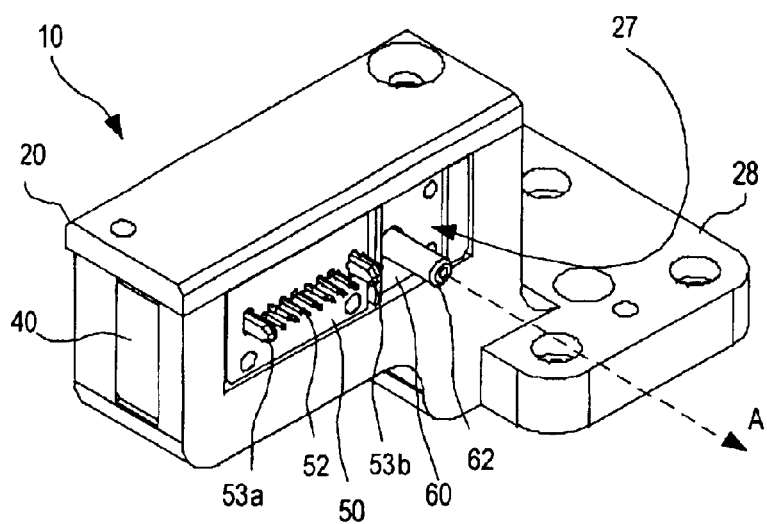
FIG. 2 is an isometric view of an assembled floating probe block assembly of FIG. 1.
Figure 5:
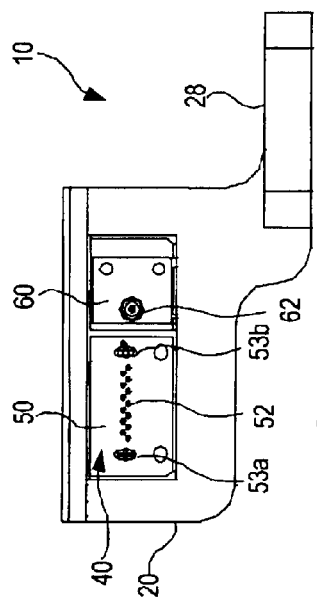
FIG. 5 is a front view of the assembled floating probe block of FIG. 1.
Figure 4:
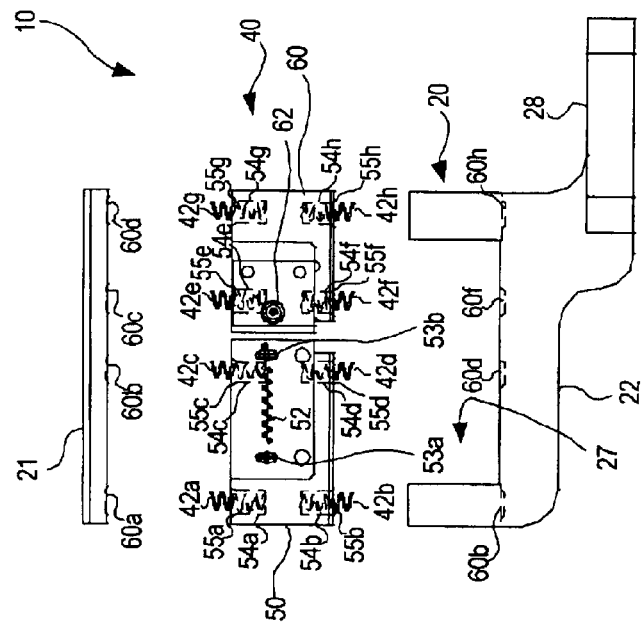
FIG. 4 is an exploded front view of the floating probe block assembly of FIG. 1.
Figure 3:
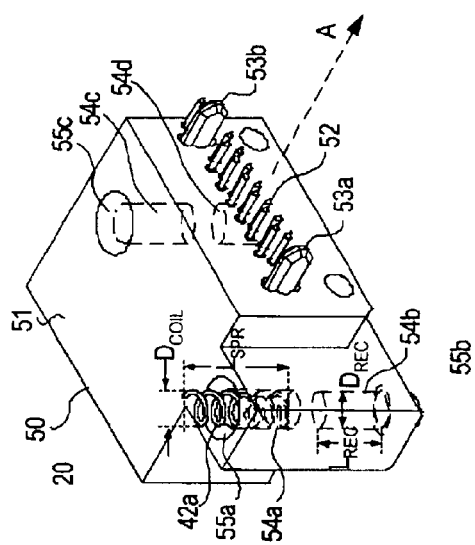
FIG. 3 is a detailed isometric view of one of the probe blocks from the floating probe block assembly of FIG. 1.

When the probe block 40 is seated in the assembled probe block frame 20 with the cover 21 attached, as shown in FIGS. 2 and 5, the self-centering springs 42a, 42b, 42c, 42d, 42e, 42f, 42g, 42h operate to self-center the probe block in both the vertical and horizontal directions. The springs 42a, 42b, 42c, 42d, 42e, 42f, 42g, 42h are mounted in the spring receptacles 54a, 54b, 54c, 54d, 54e, 54f, 54g, 54h positioned in pairs 54a/b, 54c/d, 54e/f, 54g/h on opposite sides of the block 40 such that the spring pairs 42a/b, 42c/d, 42e/f, 42g/h are directly coaxial with one another. Each pair 54a/b, 54c/d, 54e/f, 54g/h of spring receptacles is identical and each pair 42a/b, 42c/d, 42e/f, 42g/h of springs are identical in size, shape, composition, and spring characteristics (e.g., spring constant). Accordingly, the probe block 40 achieves a point of static equilibrium (or self-centering relative to the vertical plane) when the springs 42a, 42b, 42c, 42d, 42e, 42f, 42g, 42h are each compressed by the same amount.

To achieve self-centering relative to the horizontal plane, the countersinking of the hole openings 55a, 55b, 55c, 55d, 55e, 55f, 55g, 55h allows the springs 42a, 42b, 42c, 42d, 42e, 42f, 42g, 42h to deflect side to side in the shear direction. Thus, the static equilibrium point is achieved when all springs 42a, 42b, 42c, 42d, 42e, 42f, 42g, 42h are vertically linear and horizontally undeformed. This centers the probe block 40 in the horizontal direction.

During operation, the entire probe block assembly 10 is positioned in front of the fixtured DUT (not shown) in such a position that the probe block 40 is aligned to the feature to be probed on the DUT (e.g., audio jack, system connector, charge jack, etc.). When the probe block 40 is disengaged, it allows easy loading and unloading of the DUT into the fixture. When it is engaged, it has full probing/insertion into the DUT.

The present invention offers several advantages over the prior art. First, as discussed in detail above, the invention uniquely provides a floating probe assembly whose average disengaged position is directly aligned with the average DUT-to-DUT position of the mating receptacle when looking through a plane perpendicular to the probing direction. Additionally, the invention does not require significant force to self-align the probe block as prior solutions do, and therefore increases reliability while reducing wear.

Secondly, the manner in which self-centering is achieved is unique in that the mechanism for self-centering is simple and inexpensive. Self-centering is achieved through only common compression springs and countersunk holes in the floating probe block. This invention takes advantage of the force derived from compressing these springs as well as the force derived from deforming these springs in the shear (side-to-side) direction.

Finally, the floating and self-aligning aspect of the invention solves the problem of tight tolerances required to probe small test points with simultaneous poor tolerances in the location of the test points relative to the outside case of the DUT (that the fixture that holds the DUT aligns to). From DUT to DUT, the location of test points varies with respect to the DUT case due to manufacturing variances. Accordingly, by self-aligning the floating probe block to the test points directly, these variances are no longer a concern.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. A probe block assembly, comprising:
    a probe block, said probe block comprising a probe block body, one or more probes, and one or more self-centering spring receptacles, said probe block body having a first probe block body dimension along a first axis and a second probe block body dimension along a second axis;
    one or more self-centering springs, one each seated in each of said one or more self-centering spring receptacles; and
    a probe block frame which floatably seats said probe block on said one or more self-centering springs within said probe block frame along said first axis, said probe block frame having a first probe block frame dimension along said first axis that substantially matches said first probe block body dimension of said probe block body plus a predetermined small amount sufficient to allow said probe block to float within said frame along said first axis but insufficient to allow significant displacement of said probe block from a centered position of said frame along said first axis, and said probe block frame having a second probe block frame dimension along said second axis that substantially matches said second probe block body dimension of said probe block body plus a predetermined small amount sufficient to allow said probe block to float within said frame along said second axis but insufficient to allow significant displacement of said probe block from a centered position of said frame along said second axis.

2. A probe block assembly in accordance with claim 1, wherein:
    said first axis is perpendicular to said one or more probes of said probe block.

3. A probe block assembly in accordance with claim 1, wherein:
    at least two of said plurality of spring receptacles comprise a cylindrical bore with circular cross-sectional area characterized by a cylindrical bore diameter and a cylindrical bore length; and
    at least two of said plurality of springs comprise a coil spring characterized by a coil spring diameter smaller than or equal to said cylindrical bore diameter and a linear coil spring length greater than said cylindrical bore length.

4. A probe block assembly in accordance with claim 3, wherein:
    said probe block frame comprises a plurality of frame self-centering spring receptacles, one each coaxially aligning to one each of said one or more self-centering spring receptacles of said probe block when said probe block is seated within said probe block frame such that a portion of said respective self-centering spring is seated in said respective frame self-centering spring receptacle.

5. A probe block assembly in accordance with claim 4, wherein:
    said plurality of frame self-centering spring receptacles are countersinked.

6. A probe block assembly in accordance with claim 4, wherein:
    said plurality of frame self-centering spring receptacles and said plurality of probe block self-centering spring receptacles are countersinked.

7. A probe block assembly in accordance with claim 3, wherein:

said cylindrical bore diameter is a predetermined amount greater than said coil spring diameter sufficient to allow said respective coil spring to float within said cylindrical bore along said second axis but insufficient to allow significant displacement of said coil spring from a centered position within said cylindrical bore along said second axis.

8. A probe block assembly in accordance with claim 7, wherein:
said probe block frame comprises a plurality of frame self-centering spring receptacles, one each coaxially aligning to one each of said one or more self-centering spring receptacles of said probe block when said probe block is seated within said probe block frame such that a portion of said respective self-centering spring is seated in said respective frame self-centering spring receptacle.

9. A probe block assembly in accordance with claim 8, wherein:
said plurality of frame self-centering spring receptacles are countersinked.

10. A probe block assembly in accordance with claim 3, wherein:
said first axis is perpendicular to said one or more probes of said probe block.

11. A probe block assembly, comprising:
a probe block, said probe block comprising a probe block body, one or more probes, and one or more pairs of self-centering spring receptacles, each pair of said one or more pairs of self-centering spring receptacles characterized by identical dimensions, and each receptacle in a pair of said one or more pairs of receptacles located coaxially to the other receptacle in said pair and opening to different sides of the probe block, said probe block body having a first probe block body dimension along a first axis and a second probe block body dimension along a second axis;
one or more pairs of self-centering coil springs, each pair of said one or more pairs of self-centering coil springs characterized by identical coil spring dimensions and coil spring characteristics, and each self-centering coil spring of a respective pair of said self-centering coil springs respectively seated in a respective self-centering spring receptacle of a respective pair of said self-centering spring receptacles; and
a probe block frame which floatably seats said probe block on said one or more self-centering coil springs within said probe block frame along said first axis, said probe block frame having a first probe block frame dimension along said first axis that substantially matches said first probe block body dimension of said probe block body plus a predetermined small amount sufficient to allow said probe block to float within said frame along said first axis but insufficient to allow significant displacement of said probe block from a centered position of said frame along said first axis, and said probe block frame having a second probe block frame dimension along said second axis that substantially matches said second probe block body dimension of said probe block body plus a predetermined small amount sufficient to allow said probe block to float within said frame along said second axis but insufficient to allow significant displacement of said probe block from a centered position of said frame along said second axis.

12. A probe block assembly in accordance with claim 11, wherein:
said first axis is perpendicular to said one or more probes of said probe block.

13. A probe block assembly in accordance with claim 11, wherein:
at least one pair of said one or more pairs of self-centering spring receptacles comprise a cylindrical bore with circular cross-sectional area characterized by a cylindrical bore diameter and a cylindrical bore length; and
at least one pair of said one or more pairs of coil springs comprise a coil spring characterized by a coil spring diameter smaller than or equal to said cylindrical bore diameter and a linear coil spring length greater than said cylindrical bore length.

14. A probe block assembly in accordance with claim 13, wherein:
said probe block frame comprises a plurality of frame self-centering spring receptacles, one each coaxially aligning to one each of said one or more self-centering spring receptacles of said probe block when said probe block is seated within said probe block frame such that a portion of said corresponding self-centering coil spring is seated in said respective frame self-centering spring receptacle.

15. A probe block assembly in accordance with claim 14, wherein:
said plurality of frame self-centering spring receptacles are countersinked.

16. A probe block assembly in accordance with claim 14, wherein:
said plurality of frame self-centering spring receptacles and said plurality of probe block self-centering spring receptacles are countersinked.

17. A probe block assembly in accordance with claim 13, wherein:
said cylindrical bore diameter is a predetermined amount greater than said coil spring diameter sufficient to allow said respective coil spring to float within said cylindrical bore along said second axis but insufficient to allow significant displacement of said coil spring from a centered position within said cylindrical bore along said second axis.

18. A probe block assembly in accordance with claim 17, wherein:
said probe block frame comprises a plurality of frame self-centering spring receptacles, one each coaxially aligning to one each of said one or more self-centering spring receptacles of said probe block when said probe block is seated within said probe block frame such that a portion of said respective self-centering spring is seated in said respective frame self-centering spring receptacle.

19. A probe block assembly in accordance with claim 18, wherein:
said plurality of frame self-centering spring receptacles are countersinked.

20. A probe block assembly in accordance with claim 13, wherein:
said first axis is perpendicular to said one or more probes of said probe block.

* * * * *